United States Patent

Jiang et al.

[11] Patent Number: 5,956,364
[45] Date of Patent: Sep. 21, 1999

[54] VERTICAL CAVITY SURFACE EMITTING LASER WITH SHAPED CAVITY MIRROR AND METHOD OF FABRICATION

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 08/942,890

[22] Filed: Oct. 2, 1997

[51] Int. Cl.$^6$ .................................. H01S 3/08; H01S 3/19
[52] U.S. Cl. .................................. 372/96; 372/46; 372/99
[58] Field of Search .................................. 372/45, 46, 50, 372/96, 99

[56] References Cited

U.S. PATENT DOCUMENTS 5,838,715  11/1998  Corzine et al. ............................ 372/50

Primary Examiner—James W. Davie
Attorney, Agent, or Firm—Eugene A. Parsons; William E. Koch

[57] ABSTRACT

VCSEL with integrated shaped cavity mirror and method of fabrication including a substrate element, a first stack of distributed Bragg reflectors disposed on a surface of the substrate element, an active region lattice matched to a surface of the first stack of distributed Bragg reflectors, and a second stack of distributed Bragg reflectors lattice matched to a surface of the active region. The active region includes at least one quantum well layer and a plurality of barrier layers. A shaped cavity mirror is integrated with the VCSEL structure being etched directly into an uppermost surface of the second stack of distributed Bragg reflectors to form an unstable resonant laser cavity for use in single mode laser applications, or as a random phase mask for use in multi-mode laser applications.

14 Claims, 1 Drawing Sheet

5,956,364

VERTICAL CAVITY SURFACE EMITTING LASER WITH SHAPED CAVITY MIRROR AND METHOD OF FABRICATION

FIELD OF THE INVENTION

This invention relates to vertical cavity surface emitting lasers and more specifically to vertical cavity surface emitting lasers and the controlling of the laser output beam.

BACKGROUND OF THE INVENTION

Recently, there has been interest in a new type of light emitting device called a vertical cavity surface emitting laser (VCSEL). Conventional VCSELs have several potential advantages, such as a planar construction, emitting light perpendicular to the surface of the die, and the possibility of array fabrication.

Typically, VCSELs include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As \backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In many applications, a certain laser beam mode structure is required to fulfill the needed functions. For example on the one hand, in data storage applications a spatially single mode beam is needed with a certain amount of power. On the other hand, short distance optical interconnect applications based on multimode fibers, require a multimode beam with appropriate divergence to reduce the modal noise, improve coupling efficiency and meet eye safety regulations. Accordingly, there exists a need for controlling the output beam profile, including the intensity and phase distribution, of these laser devices. This is achieved by modifying the output VCSEL DBR mirror, using electron-beam lithography, x-ray lithography or focused ion beam etching technology.

Therefore, it can be readily be seen that a conventional VCSEL that has integrated as a part thereof a means for controlling the output beam profile, including the intensity and phase distribution, is needed. Thus, there is a need for developing a reliable, stable and cost effective vertical cavity surface emitting laser (VCSEL), that includes a means for phase shaping to control the VCSEL output beam characteristics.

It would be highly advantageous, therefore, to remedy the foregoing and other deficiencies inherent in the prior art.

Accordingly, it is an object of the present invention to provide a new and improved VCSEL with an integrated means for controlling the output beam for use in single mode and multimode VCSEL applications.

Another object of the invention is to provide a reliable VCSEL for multimode optical communications applications and single mode data storage applications.

And another object of the immediate invention is to provide for a VCSEL with an integrated control for output beam intensity and phase distribution that is fabricated utilizing well known lithography and etching techniques.

Yet another object of the invention is to provide for a highly manufacturable VCSEL with an integrated control for output beam intensity and phase distribution.

SUMMARY OF THE INVENTION

Briefly, to achieve the desired objects of the instant invention in accordance with a preferred embodiment thereof, provided is a VCSEL with an integrated control for output beam intensity and phase distribution. The VCSEL generally includes a substrate, a first stack of distributed Bragg reflectors, an active region, and a second stack of distributed Bragg reflectors. In a preferred embodiment, the VCSEL structure includes a shaped cavity mirror etched into an uppermost portion of the second stack of distributed Bragg reflectors to control the output beam intensity and phase distribution.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawing, in which.

DETAILED DESCRIPTION OF THE DRAWING

Figure 1:
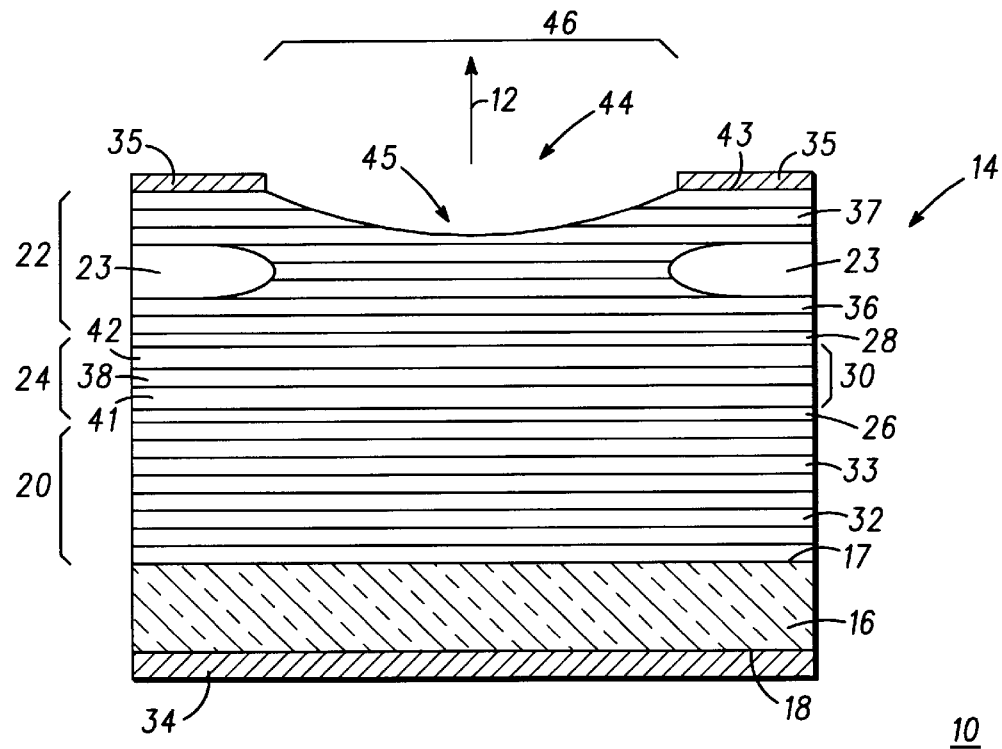
FIG. 1 is a cross-sectional view of a VCSEL structure with an integrated unstable resonant laser cavity in accordance with the present invention.

FIG. 1 is a greatly enlarged simplified cross-sectional view of a vertical cavity surface emitting laser (VCSEL) 10 with light 12 being emitted therefrom. VCSEL 10 is defined by a wafer structure 14, which in this particular embodiment is formed as a planar wafer structure. As shown in FIG. 1, VCSEL 10 is made of several main elements or features, such as a substrate 16 having surfaces 17 and 18, a plurality of stacks 20 and 22 of distributed Bragg reflectors, an active region 24, including a plurality of cladding regions 26 and 28, and an active area 30, and a plurality of contact regions 34 and 35 in electrical cooperation with active region 24. Stacks 20 and 22 of distributed Bragg reflectors each include a plurality of alternating layers illustrated by layers 32 and 33, and layers 36 and 37, respectively. Active area 30 includes at least one quantum well layer 38 and barrier layers 41 and 42 with quantum well layer 38 being positioned between barrier layers 41 and 42.

Wafer structure 14 is formed on a substrate 16, which in this specific embodiment is gallium arsenide (GaAs). GaAs is preferably used to facilitate lattice matching of the components of wafer structure 14 which in this particular embodiment emits infrared wavelength light, more particularly light less than 880 nm, dependent upon the specific material system used. A GaAs substrate is utilized so as to facilitate epitaxial growth of subsequent multiple layers that compose wafer structure 14, thus device 10. In that GaAs is absorptive to short wavelength light, more particularly light with a wavelength of 850 nm or less, light 12 is emitted upward, in a direction opposite substrate 16. It should be understood that GaAs is only utilized as an example and other semiconductor materials may be employed as substrate 16, such as silicon (Si), indium phosphide (InP), or the like. Additionally, dependent upon material system, any wavelength emission is achievable by the structure disclosed in the present invention.

Typically, any suitable epitaxial deposition method, such as molecular beam epitaxy (MBE), metal organic chemical vapor deposition (MOCVD), or the like is used to make the required multiple layers for wafer structure 14. These methods allow for the epitaxial deposition of material layers, such as aluminum gallium arsenide, aluminum arsenide, indium aluminum gallium phosphide, gallium arsenide, indium gallium phosphide, indium gallium arsenide nitride, indium gallium arsenide, indium gallium aluminum arsenide, indium gallium arsenide aluminum nitride, aluminum gallium phosphide, indium aluminum phosphide, and the like. It should be understood that epitaxial deposition is used extensively to produce the multitude of layers that comprise complete VCSEL device 10 of the present invention.

Substrate 16 has an upper surface 17 and a lower surface 18. There is disposed on upper surface 17, first stack 20 of distributed Bragg reflectors. Active region 24 is disposed on stack 20 of distributed Bragg reflectors. Active region 24 includes active structure 30 sandwiched between first cladding region 26, adjacent first stack 20 of distributed Bragg reflectors, and second cladding region 28. Second stack 22 of distributed Bragg reflectors is disposed on second cladding region 28.

Referring now to stacks 20 and 22 of distributed Bragg reflectors, it should be understood that first stack 20 of distributed Bragg reflectors is deposited first with subsequent deposition defining cladding region 26, active structure 30, cladding region 28, and second stack 22 of distributed Bragg reflectors. First and second stacks 20 and 22 of distributed Bragg reflectors are each composed of a plurality of layers, 32 and 33, and 36 and 37, respectively. Generally, thicknesses of alternating layers 32, 33, 36, and 37 are typically set as portions of a wavelength of light (not shown) that the complete VCSEL device 10 is designed to emit. Thus, specific thicknesses of the alternating layers 32, 33, 36, and 37 are a function of the designed wavelength at which VCSEL 10 is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of stacks 20 and 22 of distributed Bragg reflectors is split with one of the stacks of distributed Bragg reflectors being N-type and the other being P-type. Since doping levels are well known in the art, the doping levels will not be described herein other than to identify material either as undoped, P-typed doped such as with carbon (C), zinc (Zn) or the like, or N-typed doped such as with selenium (Se), silicon (Si), or the like. Briefly, in this particular embodiment, stack 20 of distributed Bragg reflectors and a portion of cladding region 26 are N-type doped, with a portion of cladding region 26, active structure 30, and a portion of cladding region 28 being undoped, and with a portion of cladding region 28, and second stack 22 of distributed Bragg reflectors being P-type doped.

In the present invention, first and second stacks 20 and 22 of distributed Bragg reflectors, having alternating layers 32, 33, 36, and 37, are made of any suitable materials, such as aluminum gallium arsenide (AlGaAs) with the aluminum percentage ranging from 0 to 100% or materials forming a mirror stack. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. The number of mirror pairs per stack may range from 20–40 pairs to achieve a high percentage of reflectivity, depending on the difference between the refractive indices of the layers. In the embodiments disclosed in the present invention it is anticipated that second stack 22 of distributed Bragg reflectors can alternatively include a plurality of pairs of alternating layers of a dielectric material to be deposited as a final step in the device fabrication process. Furthermore, and as illustrated in FIG. 1, second stack 22 of distributed Bragg reflectors contains an implant region 23 within second stack 22 of distributed Bragg reflectors. Implant region 23 serves to enhance carrier confinement within device 10.

More specifically, a VCSEL structure designed to emit at 780 nm will include alternating layers 32, 33, 36, and 37 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 32, 33, 36, and 37 of $Al_{0.15}Ga_{0.85}As/Al_{0.85}Ga_{0.15}As$. Irrespective of the material system utilized, layers 32 and 33 are epitaxially disposed or deposited on or overlaying substrate 16 and layers 36 and 37 are epitaxially disposed or deposited on or overlaying cladding region 28, thereby generating stacks 20 and 22 of distributed Bragg reflectors, respectively. It should be understood that while AlGaAs/AlAs DBR structures are utilized in the preferred embodiment, alternative DBR structures utilizing materials such as indium aluminum gallium phosphide and aluminum arsenide (e.g., $In_{0.49}Al_xGa_{0.51-x}P/AlAs$), aluminum gallium arsenide and aluminum arsenide ($Al_{0.51}Ga_{0.51}As/AlAs$), and indium aluminum gallium phosphide and indium aluminum phosphide (e.g., $In_{0.49}Al_xGa_{0.51-x}P/In_{0.49}Al_{0.51}P$) are anticipated by this disclosure for the device to operate at a red visible emission wavelength (635–700 nm) in association with an appropriate active medium. Additionally, it should be understood that in each of the above examples and throughout this disclosure where a percent composition of a particular element is given it should be considered only as an example. It should be further understood that variations from these examples can be large and are to be considered part of the present invention.

Stacks 20 and 22 of distributed Bragg reflectors are formed by depositing pairs of alternating layers using some convenient technique such as molecular beam epitaxy (MBE) or sputtering. In order to crystal lattice match stack 20 to substrate 16 a suitable semiconductor material system must be deposited. Approximately 20–40 mirror pairs of this material system are deposited on substrate 16 depending on the difference between the refractive indices of the layers. As will be explained presently, substrate doping is not necessary since electrical contacts to active region 24 can be made laterally to doped stack 20 of distributed Bragg reflectors.

For the sake of simplicity and to prevent overcrowding of the figure, cladding regions 26 and 28 are each shown as single layers; however, it should be understood that doping of cladding regions 26 and 28 is dependent upon whether cladding regions 26 and 28 are each made of a single layer or a plurality of layers. If cladding regions 26 and 28 are each made of a single layer, then cladding regions 26 and 28 are not doped. If cladding regions 26 and 28 include a plurality of layers, then at least a portion of the plurality of layers of cladding regions 26 and 28 are doped. With cladding regions 26 and 28 being made of a plurality of layers, the doping of the portion to be doped is consistent to its adjacent transition regions and its adjacent stack of distributed Bragg reflectors. In this particular embodiment cladding regions 26 and 28 are made of at least two components.

Multi-layer cladding region 26 is epitaxially disposed or deposited on stack 20 of distributed Bragg reflectors. First, a layer of any suitable material such as aluminum gallium arsenide (AlGaAs) having an appropriate thickness and being doped similarly to stack 20 of distributed Bragg reflectors is epitaxially deposited on stack 20 of distributed Bragg reflectors.

By way of example, a N-doped aluminum gallium arsenide layer ($Al_{0.60}Ga_{0.40}As$) is epitaxially deposited on stack 20 of distributed Bragg reflectors. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material such as aluminum gallium arsenide (AlGaAs) having an appropriate thickness is epitaxially deposited on the first layer of the cladding region 26.

Active structure 30 is represented by a plurality of layers which are epitaxially deposited or disposed on cladding region 26. It should be understood that active structure 30 includes multiple barrier layers 41 and 42 with quantum well layer 38 disposed therebetween. By way of a simple example, active structure 30 includes at least two barrier layers 41 and 42 and at least one quantum well layer 38 with the quantum well layer being positioned between the barrier layers. In a VCSEL structure that emits at 780 nm, the quantum well layer(s) are made of undoped aluminum gallium arsenide ($Al_{0.12}Ga_{0.88}As$) and the barrier layers are made of an aluminum gallium arsenide ($Al_{0.30}Ga_{0.70}As$). In a VCSEL structure that emits at 850 nm, the quantum well layer(s) are made of undoped gallium arsenide (GaAs) and the barrier layers are made of an aluminum gallium arsenide ($Al_{0.30}Ga_{0.70}As$). Typically, active structure 30 includes from one to five quantum well layers with their corresponding barrier layers. One skilled in the art will understand that more quantum well layers and barrier layers can be used depending upon the application. Active region 24 and first and second stacks 20 and 22 of distributed Bragg reflectors respectively are configured to emit light with a wavelength of approximately 780 nm or 850 nm.

For the sake of simplicity and to prevent overcrowding of the figure, cladding region 28 is shown as a single layer; however, as previously stated, it should be understood that cladding region 28 is made of multiple layers that are disposed or deposited epitaxially on active structure 30. First, a layer of any suitable undoped cladding material is epitaxially deposited to an appropriate thickness on active structure 30. Second, a layer of any suitable doped cladding material is epitaxially deposited on the undoped cladding material.

By way of example, an undoped aluminum gallium arsenide ($Al_{0.30}Ga_{0.70}As$) layer is epitaxially deposited on active structure 30. Generally, the undoped AlGaAs has a thickness that is determined by the wavelength of light that is to be emitted from the VCSEL device, thereby allowing the thickness of the AlGaAs layer to be any suitable thickness. Subsequently, a doped aluminum gallium arsenide ($Al_{0.60}Ga_{0.40}As$) layer is epitaxially deposited on the undoped layer. The doped layer is generally doped with a P-type dopant.

If desired, once the material layers have been fabricated on substrate 16, the material layers can be patterned by any suitable method or combination of methods, such as photolithography, etching, deposition, or the like, to form a ridge VCSEL (not shown) embodiment of the device shown. For example, a dot pattern can be formed by a photolithography process on the material layers where portions of the material layers are exposed and where portions of the material layers are covered by the dot pattern. The dot pattern is then etched by any suitable technique such as dry etching or wet etching where the portions that are exposed are removed while the covered portions are not removed, thereby forming a ridge structure.

To complete wafer structure 14, more particularly device, 10, an electrical contact 34 is coupled to a surface 18 of substrate 16. A second electrical contact 35 is coupled to distributed Bragg reflector 22. As previously stated, light 12 is emitted from device 10 in a direction opposite substrate 16. Various changes and modifications to the embodiments herein chosen for purposes of illustration will readily occur to those skilled in the art. For example, it should be understood that VCSEL structure symmetry exists for both the p and n dopants as well as electrically inverted structure designs.

Once VCSEL device 10 is fabricated according to the above detailed structure, a shaped cavity mirror 44 is fabricated within second stack 22 of distributed Bragg reflectors of device 10. As illustrated in FIG. 1, shaped cavity mirror 44, is formed as a unstable resonant laser cavity 45 within an emission aperture 46 defined by contacts 35. More specifically, shaped cavity mirror 44 is formed into device 10 by etching into an uppermost surface 43, or layer, of second stack 22 of distributed Bragg reflectors. Device 10 composed of first stack 20 of distributed Bragg reflectors, active region 24 and second stack 22 of distributed Bragg reflectors forms unstable resonant laser cavity 45 due to the structure of shaped cavity mirror 44. Unstable resonant laser cavity 45 is formed by etching into uppermost surface 43 of second stack 22 of distributed Bragg reflectors a concave mirror structure using well known photolithography methods such as electron-beam or e-beam photolithography, focused ion beam cutting/etching techniques, x-ray photolithography, or the like.

Once complete, device 10, more particularly shaped cavity mirror 44, allows for a method to adjust/control the output beam profile, including the intensity and phase distribution, by modifying the output VCSEL mirror stack. To achieve single mode operation for large diameter devices, unstable resonant laser cavity structure 45 is adopted by etching stack 22 of distributed Bragg reflectors into a concave mirror structure. This type of structure has a higher loss to higher order beam, thus is preferable in single mode operation.

Figure 2:
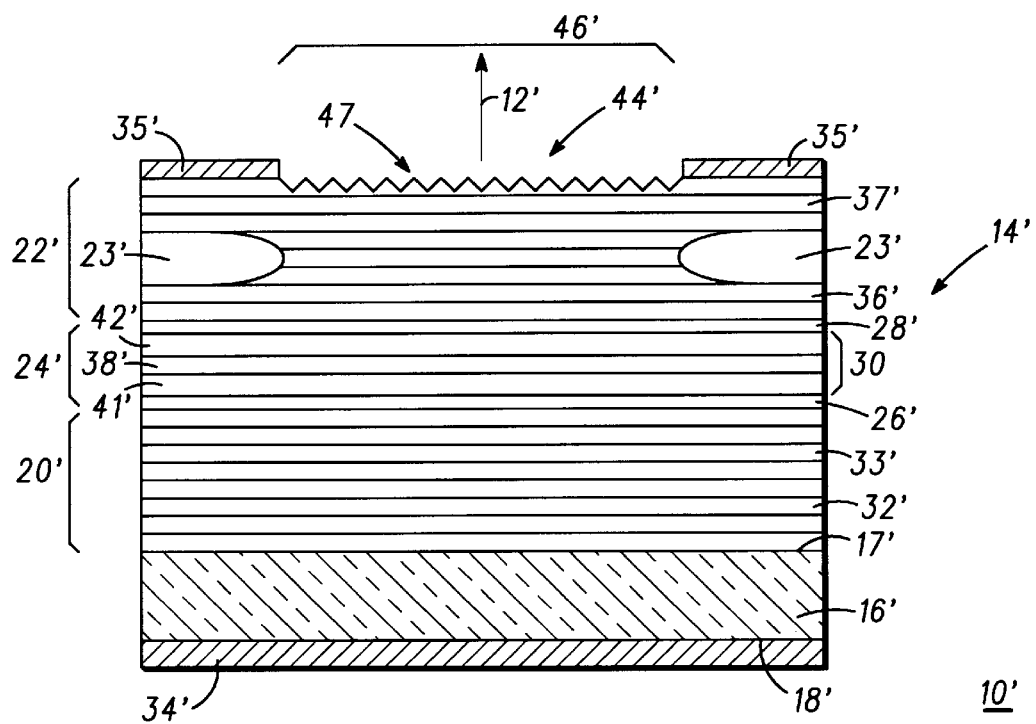
FIG. 2 is a cross-sectional view of a VCSEL structure with an integrated random phase mask in accordance with the present invention.

Referring now to FIG. 2, illustrated in simplified cross-sectional view is an alternative embodiment of a VCSEL device with an integrated shaped cavity mirror 44' according to the present invention. It should be noted that all components similar to the components illustrated in FIG. 1 are designated with similar numbers, having a prime added to indicate the different embodiment. Accordingly, illustrated is VCSEL device 10' with light 12' being emitted therefrom.

VCSEL 10' is fabricated generally similar to device 10 of FIG. 1. More specifically, VCSEL 10' is defined by a wafer structure 14', which in this particular embodiment is formed as a planar wafer structure. As shown in FIG. 2, VCSEL 10' is made of several main elements or features, such as a substrate 16' having surfaces 17' and 18', stacks 20' and 22' of distributed Bragg reflectors, active region 24', including cladding regions 26' and 28', and active area 30', and contact regions 34' and 35'. Stacks 20' and 22' of distributed Bragg reflectors each include a plurality of alternating layers illustrated by layers 32' and 33', and layers 36' and 37', respectively. Active area 30' includes at least one quantum well layer 38' and barrier layers 41' and 42' with quantum well layer 38' being positioned between barrier layers 41' and 42'.

Once wafer structure 14' is fabricated according to the disclosed methods as detailed with regard to device 10 of FIG. 1, a shaped cavity mirror 44', more particularly a random phase mask 47 is defined within an emission aperture 46' defined by contacts 35'. More specifically, in this particular embodiment random phase mask 47 is etched into an uppermost surface 43', or layer, of second stack 22' of distributed Bragg reflectors. This random phase mask 47 will allow for the output beam to have low coherence, thus good for multimode laser applications, such as multimode fiber based optical communications, due to low modal noise and mode partition noise. Thus, a VCSEL device 10' with an integrated random phase mask 47 is defined. Random phase mask 47 is fabricated in a path of the laser emission 12', thereby controlling the intensity and phase distribution of laser emission 12' as it passes therethrough second stack 22 of distributed Bragg reflectors and random phase mask 47 defined therein.

By now it should be appreciated that a novel article and method for making the article have been provided. A vertical cavity surface emitting laser with an integrated shaped cavity mirror is disclosed having improved performance in terms of the ability to control the intensity and phase distribution of the laser emission generated therein.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser device comprising:
   a substrate having a surface;
   a first stack of distributed Bragg reflectors disposed on the surface of the substrate;
   an active region disposed on the first stack of distributed Bragg reflectors;
   a second stack of distributed Bragg reflectors disposed on the active region; and
   a shaped cavity mirror fabricated as a random phase mask for use in multimode laser applications, integrated with the second stack of distributed Bragg reflectors.

2. A vertical cavity surface emitting laser as claimed in claim 1 wherein the laser is fabricated to emit light with a wavelength of 880 nm or less, thereby emitting a laser emission in a direction opposite the substrate.

3. A vertical cavity surface emitting laser as claimed in claim 1 wherein the shaped cavity mirror is formed in an uppermost portion of the second stack of distributed Bragg reflectors.

4. A vertical cavity surface emitting laser as claimed in claim 3 wherein the shaped cavity mirror is a concave mirror structure forming an unstable resonant laser cavity for use in single mode laser applications.

5. A vertical cavity surface emitting laser as claimed in claim 3 wherein the shaped cavity mirror is fabricated using electron beam photolithography.

6. A vertical cavity surface emitting laser as claimed in claim 3 wherein the shaped cavity mirror is fabricated using focused ion beam cutting/etching technology.

7. A vertical cavity surface emitting laser as claimed in claim 3 wherein the shaped cavity mirror is fabricated using x-ray lithography.

8. A vertical cavity surface emitting laser device comprising:
   a substrate having a surface;
   a first stack of distributed Bragg reflectors including a plurality of pairs of alternating layers disposed on the surface of the substrate, the first stack of distributed Bragg reflectors having a surface;
   an active region having a first and a second surface and including an active structure sandwiched between a first cladding region and a second cladding region, the active structure including at least one quantum well structure and a plurality of barrier layers, the active region being lattice matched to the surface of the first stack of distributed Bragg reflectors;
   a second stack of distributed Bragg reflectors lattice matched to the second surface of the active region and including a plurality of pairs of alternating layers; and
   a shaped cavity mirror fabricated as a random phase mask formed in an uppermost portion of the second stack of distributed Bragg reflectors, and within a path of an emission generated by the vertical cavity surface emitting laser.

9. A vertical cavity surface emitting laser as claimed in claim 8 wherein the active region and the first and second stacks of distributed Bragg reflectors are configured to emit light in a direction opposite the substrate with a wavelength of 880 nm or less.

10. A vertical cavity surface emitting laser as claimed in claim 8 wherein the shaped cavity mirror is etched into the uppermost portion of the second stack of distributed Bragg reflectors.

11. A vertical cavity surface emitting laser as claimed in claim 10 wherein the shaped cavity mirror is fabricated using one of electron beam photolithography, focused ion beam cutting/etching, and x-ray lithography.

12. A vertical cavity surface emitting laser as claimed in claim 11 wherein the shaped cavity mirror is fabricated as a concave mirror to form an unstable resonant laser cavity.

13. A vertical cavity surface emitting laser as claimed in claim 12 wherein the unstable resonant laser cavity is intended for use in single mode laser applications including data storage.

14. A vertical cavity surface emitting laser as claimed in claim 8 wherein the random phase mask is intended for use in multimode laser applications including short distance optical interconnects based on multimode fibers.

* * * * *